United States Patent
Chidambarrao et al.

(10) Patent No.: US 6,869,866 B1
(45) Date of Patent: Mar. 22, 2005

(54) SILICIDE PROXIMITY STRUCTURES FOR CMOS DEVICE PERFORMANCE IMPROVEMENTS

(75) Inventors: Dureseti Chidambarrao, Weston, CT (US); Omer H. Dokumaci, Wappingers Falls, NY (US); Rajesh Rengarajan, Wappingers Falls, NY (US); An L. Steegen, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,310

(22) Filed: Sep. 22, 2003

(51) Int. Cl.$^7$ .......................... H01L 21/38; H01L 21/28
(52) U.S. Cl. ........................................ 438/581; 438/595
(58) Field of Search .............................. 438/266, 267, 438/275, 289, 303, 304, 581, 595, 596

(56) References Cited

U.S. PATENT DOCUMENTS

| | | |
|---|---|---|
| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,668,024 A * | 9/1997 | Tsai et al. .................... 438/199 |
| 5,670,798 A | 9/1997 | Schetzina |
| 5,679,965 A | 10/1997 | Schetzina |

(List continued on next page.)

OTHER PUBLICATIONS

Novel Locally Strained Channel Technique for High Performance 55nm CMOS K. Ota, et al. 2002 IEEE, 2.2.1–2.2.4, IEDM 27.

(List continued on next page.)

*Primary Examiner*—Phuc T. Dang
(74) *Attorney, Agent, or Firm*—McGuireWoods LLP; Joseph P. Abate

(57) ABSTRACT

A method for manufacturing an integrated circuit having a plurality of semiconductor devices including an n-type field effect transistor and a p-type field effect transistor on a semiconductor wafer by creating a spacer having a first width for the n-type field effect transistor and creating a spacer having a second width for the p-type field effect transistor, the first width being greater than the second width and depositing silicide material on the semiconductor wafer such that tensile mechanical stresses are formed within a channel of the n-type field effect transistor and compressive stresses are formed within a channel of the p-type field effect transistor.

23 Claims, 6 Drawing Sheets

U.S. PATENT DOCUMENTS

| | | | |
|---|---|---|---|
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,274,444 | B1 | 8/2001 | Wang |
| 6,281,532 | B1 | 8/2001 | Doyle et al. |
| 6,284,626 | B1 | 9/2001 | Kim |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,975 | B1 | 6/2002 | Brunner et al. |
| 6,406,973 | B1 | 6/2002 | Lee |
| 6,476,462 | B2 | 11/2002 | Shimizu et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,806,584 | B2 * | 10/2004 | Fung et al. .................. 257/368 |
| 2002/0074598 | A1 | 6/2002 | Doyle et al. |
| 2002/0086472 | A1 | 7/2002 | Roberds et al. |
| 2002/0090791 | A1 | 7/2002 | Doyle et al. |
| 2003/0040158 | A1 | 2/2003 | Saitoh |

OTHER PUBLICATIONS

Local Mechanical–Stress Control (LMC): A New Technique for CMOS—Performance Enchancement A. Shimizu, et al. 2001 IEEE, 19.4.1–19.4.4, IEDM 00–433.

Mechanical Stress Effect of Etch–Stop Nitride and its Impact on Deep Submicron Transistor Design Shinya Ito, et al. 2000 IEEE, 10.7.1–10,7.4, IEDM 00–247.

A Highly Dense, High–Performance 130nm node CMOS Technology for Large Scale System –on–a– Chip Applications F. Ootsuka, et al. 2000 IEEE, 23.5.1–23.5.4, IEDM 00–575.

NMOS Drive Current Reduction Caused by Transistor–Layout and Trench Isolation Induced Stress Gregory Scott, et al. 1999 IEEE, 34.4.1–34.4.4, IEDM 99–827.

Transconductance Enhancement in Deep Submicron Strained–Si n– MOSFETs Kern (Ken) Rim, et al. 1998 IEEE, 26.8.1–26.8.4, IEDM 98–707.

Characteristics and Device Design of Sub–100 nm Strained Si N– and PMOSFET's K. Rim, et al. 2002 IEEE, 98–99, 2002 Symposium on VLSI Technology Digest of Technical Papers.

Kern Rim, et al., "Tranconductance Enhancement in Deep Submicron Strained–Si n–MOSFETs", International Electron Devices Meeting, 26, 8, 1, IEEE, Sep. 1998.

Kern Rim, et al., "Characteristics and Device Design of Sub–100 nm Strained Si N– and PMOSFETs", 2002 Symposium On VLSI Technology Digest of Technical Papers, IEEE, pp 98–99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High–Performance 130nm node CMOS Technology for Large Scale System–on–a–Chip Application", International Electron Devices Meeting, 23.5.1, IEEE, Apr. 2000.

Shinya Ito, et al., "Mechanical Stress Effect of Etch–Stop Nitride and its Impact on Deep Submicron Transistor Design", International Electron Devices Meeting, 10.7.1, IEEE, Apr. 2000.

A. Shimizu, et al., "Local Mechanical–Stress Control (LMC): A New Technique for CMOS–Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

SILICIDE PROXIMITY STRUCTURES FOR CMOS DEVICE PERFORMANCE IMPROVEMENTS

BACKGROUND OF INVENTION

The invention generally relates to methods for manufacturing a semiconductor device with improved device performance, and more particularly to methods for manufacturing semiconductor devices which impose tensile and compressive stresses in the substrate of the device during device fabrication.

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, either tensile stress or compressive stress, discriminatively affects the characteristics of an n-type device and a p-type device.

In order to maximize the performance of both NFETs and PFETs within integrated circuit (IC) chips, the stress components should be engineered and applied differently for NFETs and PFETs. That is, because the type of stress which is beneficial for the performance of an NFET is generally disadvantageous for the performance of the PFET. More particularly, when a device is in tension, in the direction of current flow in a planar device, the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETS, respectively. When this method is used, the isolation region for the NFET device contain a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal directions.

Alternatively, liners on gate sidewalls, have been proposed to selectively induce the appropriate strain in the channels of the FET devices (see Ootsuka et al., IEDM 2000, p.575, for example). By providing spacers or liners, the appropriate stress is applied closer to the device than the stress applied as a result of the trench isolation fill technique.

While these methods do provide structures that have tensile stresses being applied to the NFET device and compressive stresses being applied along the longitudinal direction of the PFET device, they may require additional materials and/or more complex processing, and thus, resulting in higher cost. In addition, in the methods described above, for example, the stresses in the channel are relatively moderate (i.e., for example, about 200 to about 300 MPa), which provide approximately a 10% benefit in device performance. Thus, it is desired to provide more cost-effective and simplified methods for creating stronger tensile and compressive stresses in the channels NFETs and PFETs, respectively. It is further desired to create larger tensile stresses in the channels of the NFETs than the tensile stresses created as a result of the known processes described above.

SUMMARY OF INVENTION

In the first aspect, this invention provides a method for manufacturing an integrated circuit comprising a plurality of semiconductor devices including an n-type field effect transistor and a p-type field effect transistor on a silicon wafer by creating a first spacer and a second spacer on the n-type field effect transistor and on the p-type field effect transistor. At least a portion of the first spacer is removed from the p-type field effect transistor, and silicide forming material is deposited on the p-type field effect transistor and the n-type field effect transistor, such that tensile mechanical stresses are formed within a channel of the n-type field effect transistor and compressive mechanical stresses are formed within a channel of the p-type field effect transistor.

In a second aspect, this invention separately provides a method for manufacturing an integrated circuit comprising a plurality of semiconductor devices including an n-type field effect transistor and a p-type field effect transistor on a semiconductor wafer by creating a spacer having a first width for the n-type field effect transistor. A spacer is created having a second width for the p-type field effect transistor, the first width being greater than the second width. Silicide forming material is deposited on the semiconductor wafer such that tensile mechanical stresses are formed within a channel of the n-type field effect transistor and compressive stresses are formed within a channel of the p-type field effect transistor.

DETAILED DESCRIPTION

The invention provides a method for fabricating devices with improved performance characteristics. The invention relates to the improved characteristics of a device. Generally, silicidation is known to create significant stresses in the silicon and that stress distributions resulting from silicidation are highly nonuniform. These properties of silicidation are used by the invention to control the stresses in complimentary metal oxide semiconductor (CMOS)PFETs and NFETs. In an embodiment of the invention, different spacer widths and undercut combinations are used to modulate silicide distances in order to control the stress in the channels of NFET and PFET devices.

In the methods and devices according to the invention, the stresses are self-aligned to the gate. In the devices formed with the isolation induced stress structures, the stresses are not self-aligned to the gate. In addition, in the methods and devices according to the invention, the stress levels attained under the gate in the silicon are much larger than the isolation-based or spacer-based or liner-based approaches. For example, stress of about a few hundred MPa to about a few GPa in the silicon under the gate may be attained according to the invention.

Figure 1:
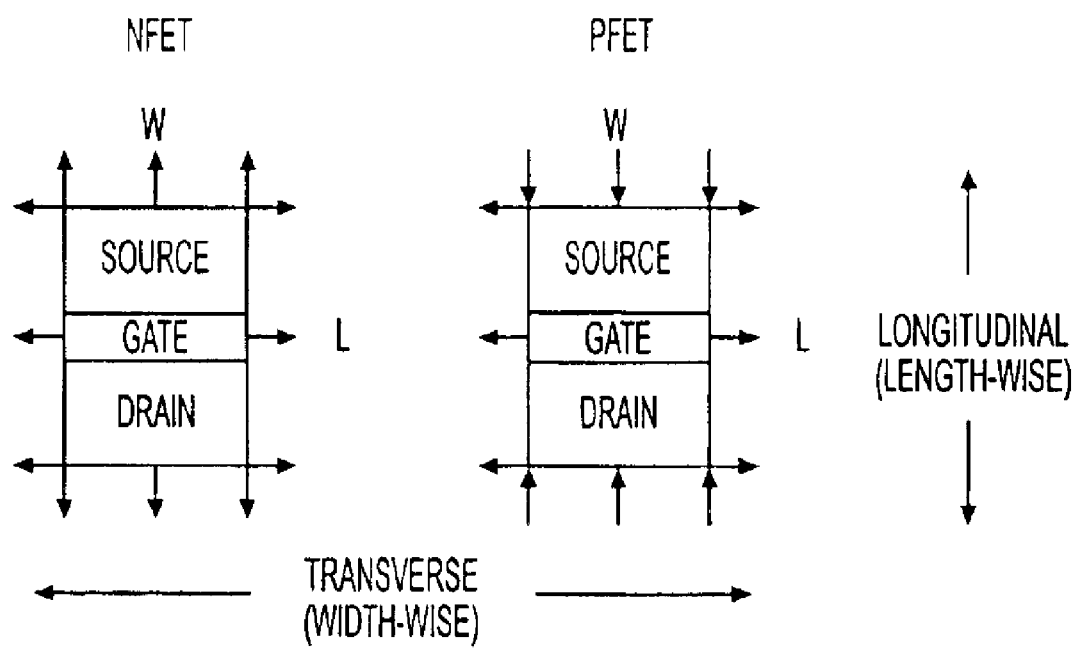
FIG. 1 depicts desired stress states for PFETs and NFETS.

FIG. 1 illustrates desired stress states for improving the performance of PFETs and NFETs (see Wang et al., IEEE Trans. Electron Dev., v.50, p.529, 2003). In FIG. 1, an NFET and a PFET are shown to have a source region, a gate region and a drain region. The NFET and PFET are shown to have arrows extending outward from the active area to illustrate tensile stresses. The arrows extending inward toward the PFET device are illustrative of compressive forces. More specifically, the outwardly extending arrows, shown extending from the NFET, illustrate a tensile stress that is desired in the transverse and longitudinal directions of the device. Similarly, the inwardly extending arrows, shown with relation to the PFET, illustrate a desired longitudinal compressive stress. The range of stresses typically desired to influence device drive currents is on the order of about a few hundred MPa, such as, for example 500 MPa, to about a few GPa, such as, for example 3 GPa. The width and the length of the active area of each device is represented by "W" and "L", respectively. It should be understood that each of the longitudinal or transverse stress components can be individually tailored to provide the performance enhancements for both devices (i.e., the NFET and the PFET).

Figure 2A:
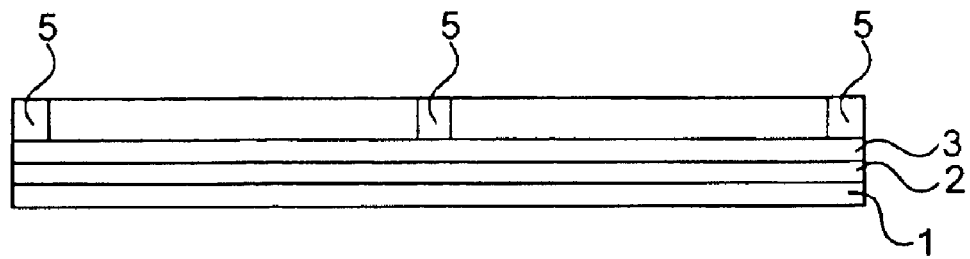
FIGS. 2(a) through 2(f) depict a process for forming stresses in MOSFETs according to the invention.

FIGS. 2(a)–2(f) generally illustrate an exemplary process for forming an integrated circuit with p-type and n-type semiconductor devices. FIGS. 2(a) through 2(d) explain processes that are known, and thus any known applicable processes may be used. FIG. 2(a) illustrates the structure after shallow trenches 5 (STI) are formed. A SOI (silicon-on-insulator) wafer which has a stack of silicon 1, buried oxide 2, and a silicon layer 3 is used. FIGS. 2(a) through 2(j) depict a general exemplary process for forming the MOSFETs according to this invention. FIGS. 2(a) through 2(d) explain processes that are known, and thus any known applicable processes may be used. FIG. 2(a) illustrates the structure after shallow trenches 5 (STI) are formed. A SOI (silicon-on-insulator) wafer which has a stack of silicon 1, buried oxide 2, and a silicon layer 3 is used.

Generally, to form the STI on SOI wafers, a thin (~50 Å) layer of silicon dioxide $SiO_2$ (pad oxide) (not shown) is grown on the silicon layer 3, which is on the buried oxide layer 2 on the silicon substrate 1, by reacting silicon and oxygen at high temperatures. A thin layer (about 1000 Å to about 2500 Å) of pad silicon nitride ($Si_3N_4$) (not shown) is then deposited using chemical vapor deposition (CVD). Next, the patterned photoresist with a thickness of about 0.5 to about 1.0 microns is deposited, and the structure is exposed and developed to define the trench areas 5. Next, the exposed $SiO_2$ and the $Si_3N_4$ are etched using reactive ion etching (RIE). Next, an oxygen plasma is used to burn off the photoresist layer. A wet etch is used to remove the pad $Si_3N_4$ and pad oxide. Then, an oxide layer is deposited to fill the trenches and the surface oxide is removed using chemical mechanical polishing (CMP). This completes the formation of STI as seen in FIG. 2(a).

Figure 2B:
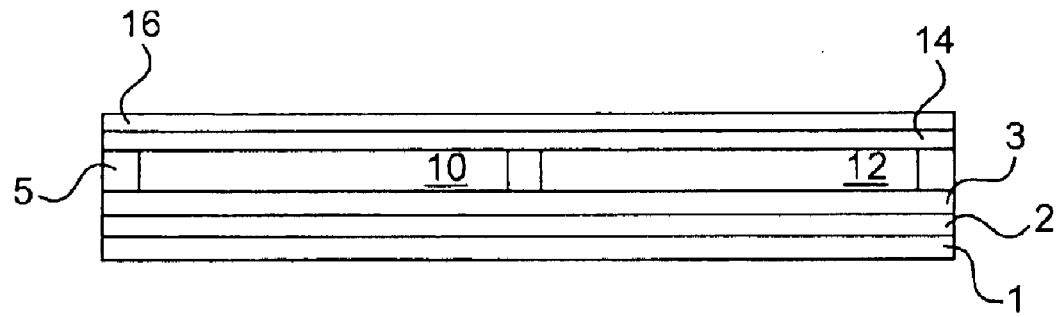

Next, a sacrificial oxide (not shown) of about 50 Å is grown on the silicon. Then, as shown in FIG. 2(b) an n-well 10 and a p-well 12 are formed. Patterned photoresist layers are used to successively form the n-well 10 (using, for example, multiple implants of Phosphorous ions) and the p-well 12 (using, for example, multiple implants of Boron ions). The well implants 10 and 12 are then optionally annealed. The sacrificial oxide layer is then removed using a wet HF solution, such that a clean silicon surface is left behind.

Next, as shown in FIG. 2(b), a gate oxide layer 14 of about 10 Å to about 100 Å is grown. On the gate oxide layer 14, a polysilicon layer 16 is deposited using CVD to a thickness of about 500 Å to about 1500 Å to form the gate electrodes 18 and 20 shown in FIG. 2(c). Patterned photoresist layers (not shown) are used to define the gate electrodes. RIE is used to etch the exposed portions of the polysilicon layer 16 and the photoresist patterns are stripped away in order to complete formation of the gate stack of the n-type transistor 17 and the gate stack of the p-type transistor 19.

Figure 2C:
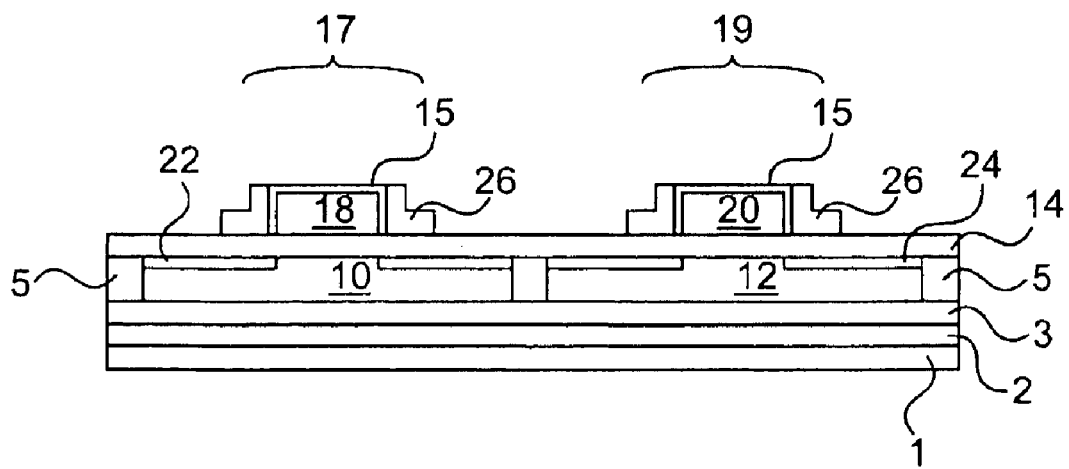

FIG. 2(c) shows the formed gate electrodes 18 and 20. A thin layer of oxide 15 is then grown on the remaining polysilicon. Patterned photoresist layers (not shown), which are later removed, are used to successively tip (and halo countering doping implants) implant the n-type and p-type transistors. For n-type transistors, a very shallow and low dose implant of arsenic ions, for example, may be used to form the p-tip 22 (while a Boron implant, for example, may be used for halos). For p-type transistors, a very shallow and low dose implant of $BF_2$ ions, for example, may be used to form n-tip 24 (while an arsenic implant may, for example, be used for halos).

Figure 2D:
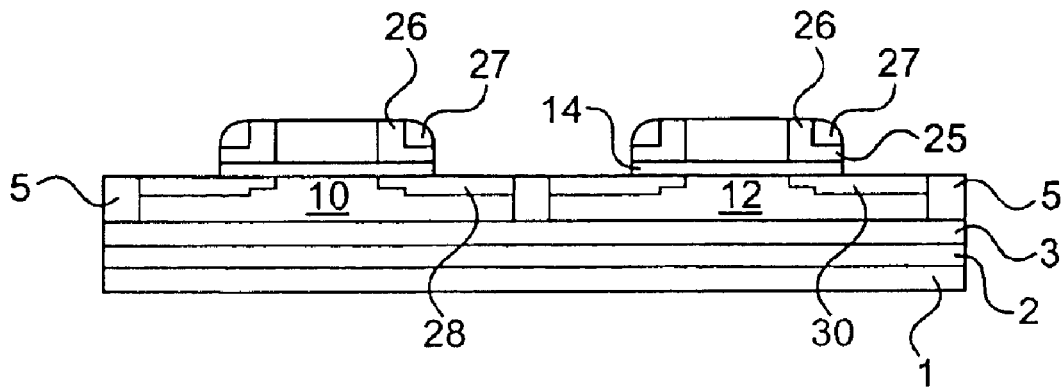
Figure 2E:
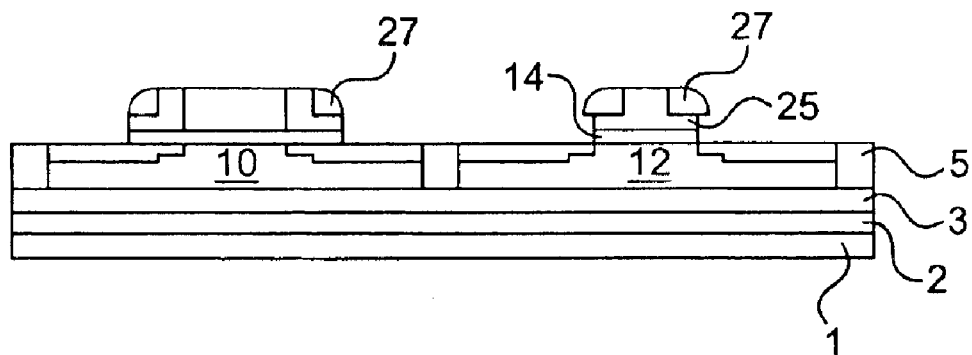

Still referring to FIG. 2(c), oxide spacers 26 are formed by depositing a oxide material via oxidation. After oxidation is performed, the oxide is etched using a mask (not shown) to form the oxide spacers 26. The oxide along the edge of the gates forms an oxide spacer 26 which helps prevent a short between the gate of the NFET and PFET and the diffusions of the respective devices. Next, as shown in FIG. 2(d), nitride layer (not shown) using CVD to a thickness of about 100 Å to about 1000 Å and then etching the nitride from the regions other than the sidewalls of the gate to form nitride spacers 27.

Patterned photoresist layers (not shown), which are removed prior to the next stage of the process, are used to successively create the source/drain regions of the transistors. In FIG. 2(d), for the n-type transistors, a shallow and high-dose of arsenic ions, for example, may be used to form the source/drain regions 28 while the p-type transistors are covered with the corresponding photoresist layer. For the p-type transistors, a shallow and high dose of $BF_2$ ions, for example, may be used to form the source/drain regions 30 while the n-type transistors are covered with the corresponding photoresist layer. An anneal is then used to activate the implants.

In methods according to the invention, the NFET devices are masked while at least a portion of the oxide remaining on the PFET devices is etched. In the structure shown in FIG. 2(e), the NFET device is masked, using a mask (not shown) while the oxide on the PFET device is subjected to further etching. In particular, the mask covers the NFETs so that the oxide 25 of the oxide spacer 26 below the nitride spacers 27 of the NFET is maintained while at least a portion of the oxide 25 of the oxide spacer 26 below the nitride spacers 27 of the PFET is removed, via, for example, etching. The resulting structure is shown in FIG. 2(h), which illustrates that at least a portion of the oxide below the nitride spacer 27 of the PFET is removed while the oxide spacer 25 below the nitride spacer 27 of the NFET is maintained. The mask covering the NFETs is then removed.

The oxide undercut region can be typically about 20 nm to about 50 nm from the edge of the spacer. In that case, the PFET silicide would then be closer to the channel by about 20 nm to about 50 nm. The silicide to NFET gate distance is the same as the spacer width which is about 20 nm to about 100 nm. The standard photoresist mask technique is used to mask the NFET while etching the oxide undercut for the PFET.

Figure 2F:
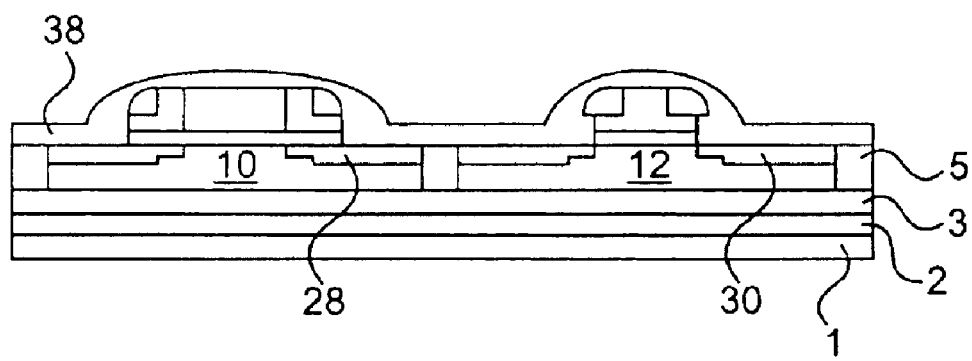

Next, as shown in FIG. 2(f), silicide material 38 having a thickness of about 30 Å to about 200 Å is deposited on the silicon. The deposited material fills the space below the nitride spacer of the PFET. As a result, the deposited material is closer to the gate region of the PFET device than the gate region of the NFET device. Metal, such as, for example, Co, HF, Mo, Ni, $Pd_2$, Pt, Ta, Ti, W, and Zr may be used and the metal may be deposited over the wafer via, for example, evaporation, sputtering, or CVD techniques. The silicide is formed through a high temperature reaction. The silicide is closer to the PFET gate by a distance that the oxide is undercut.

Then, the structure is heated to a temperature of about 350° C. to about 800° C. depending on the type of silicide being considered in order to allow the deposited metal to react with the silicon. During sintering, silicide only forms in the regions where the metal is in direct contact with silicon or polysilicon. In the regions, such as, the source, drain and gate regions, where the deposited metal is in contact with silicon, the deposited metal or low resistance material reacts with the silicon to form silicide. In the other regions (i.e., where the deposited metal is not in contact with silicon), the deposited metal remains unchanged. This process aligns the silicide to the exposed silicon and is called "self-aligned silicide" or silicide. The remaining unreacted metal is then removed, for example, with a selective etch. After the silicidation steps, standard processes for middle-of-the-line are used such as nitride liner, oxide fill, contact formation, followed by interconnect formation, etc.

Figure 3:
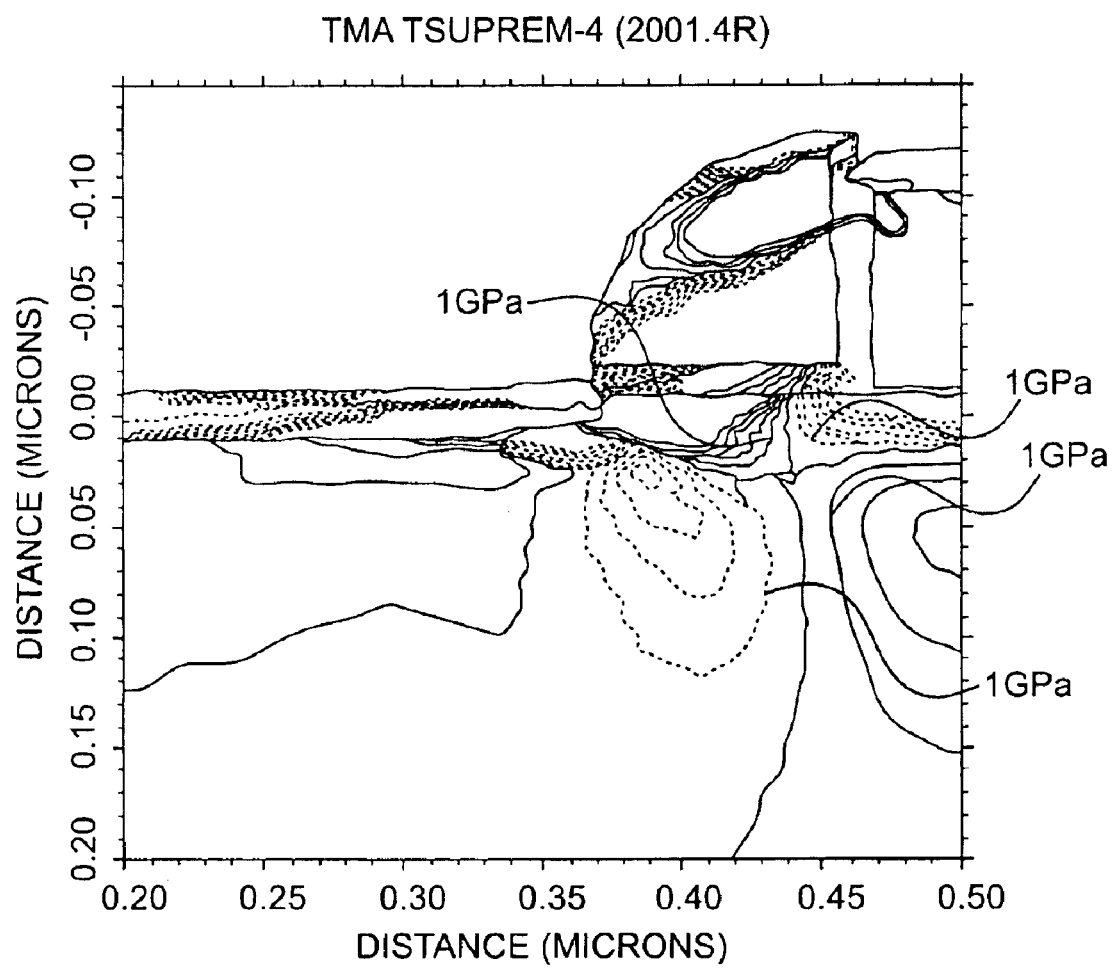
FIG. 3 depicts stresses in a silicon structure after depositing silicide material on a FET according to the invention.

FIG. 3 illustrates lateral stresses created in a silicon wafer from silicide growth. In particular, FIG. 3 shows the growth of $CoSi_2$, for example, in the source/drain regions of a FET. In the structure illustrated in FIG. 3, the source and drain regions are separated by a nitride/oxide spacer with a width of approximately 100 nm. The dashed lines in FIG. 3 represent tensile stress and the solid lines in FIG. 3 represent compressive stress. As can be seen from FIG. 3, tensile stresses are present in the channel area of the gate and compressive stresses are present in the region next to the silicide. More particularly, the stress levels in the exemplary structure shown in FIG. 3 vary from being highly compressive next to the silicide for about 70 nm before swinging through zero and becoming highly tensile under the gate.

In the exemplary structure shown in FIG. 3, the stress levels in the compressive zone reach about −1.5 GPa while the tensile stresses reach about +1.3 GPa. If, for example, a channel of a PFET is subjected to a compressive stress of about −1.5 GPa, the PFET would have about a 35% improvement in device performance. With regard to NFET devices, if the channel of an NFET is subjected to a stress of about +1.3 GPa, the NFET would have about a 50% improvement in device performance.

In another example, if a channel of a PFET is subjected to a compressive stress of about −0.9 GPa, the PFET would have about a 20% improvement in device performance. Further, if a channel of an NFET is subjected to a tensile stress of about +1.1 GPa, the NFET would have about a 42% improvement in device performance.

In the invention, the characteristics of the stresses created in the silicon are used to create the desired stresses (i.e., tensile or compressive) in the channel of the device. FIG. 3 shows that the extent of a compressive zone and tensile zone in the wafer depends on the distance between the silicide and the gate edge. Thus, in the invention the width of the spacers along with the characteristics of the stresses, as discussed above, are used to create regions with the desired stresses (i.e., tensile or compressive) in the channel of the device.

It should be understood that this invention is readily applicable to bulk or layered SiGe substrates. It should also be understood that this invention may also be used with damascene gate structures, which have been proposed for use of high k dielectric gate oxides.

In the structure shown in FIG. 3, the silicide material is present in the region beyond the spacer and tensile stress is created in the channel of the device. Thus, the spacer illustrated in FIG. 3, which separates the silicide material from the gate edge by about 100 nm may be used for NFET devices. Accordingly, it is possible to provide silicide material in the region beyond a spacer, having a width of about 100 nm to create tensile stresses in the channel of the device.

However, as shown in FIG. 3, compressive stresses are created in the region next to the silicide material before transitioning into tensile stresses further from the silicide material. Thus, in order to create compressive stresses in the channels of PFET devices, the silicide should be closer to the gate region of the PFET devices. More particular, the width of the spacer illustrated in FIG. 3 is too large for creating compressive stresses in the channel of a PFET. Thus, for PFET devices, spacers with smaller widths than the spacers for NFET devices should be used in order to create the desired compressive stresses in the channel of the device. One way to reduce the width of the spacers of the PFET devices is to undercut part of the spacer of PFET which is situated on the silicon wafer.

Figure 4:
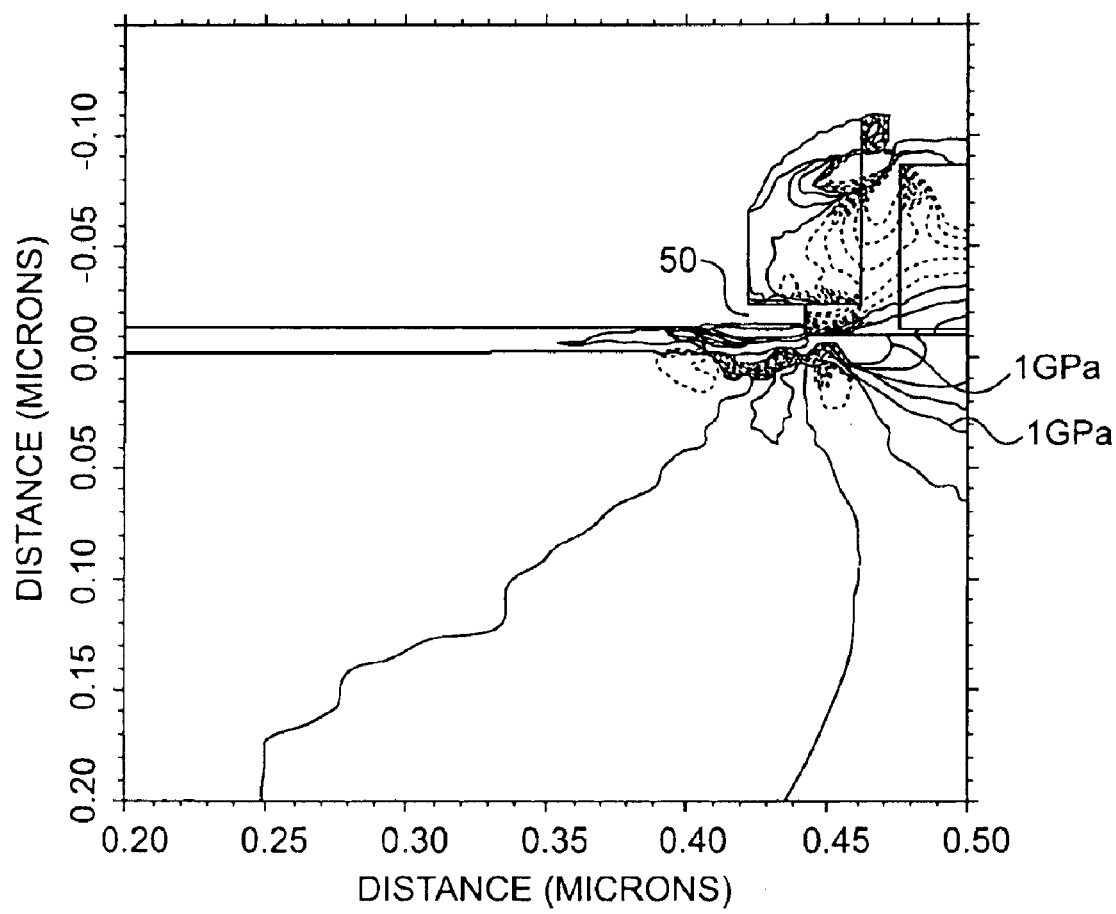
FIG. 4 depicts stresses in a silicon structure after depositing silicide material on a PFET according to the invention.

FIG. 4 illustrates the stresses in a silicon structure after depositing silicide material on a PFET according to the invention. As shown in FIG. 4, in order to deposit the silicide material closer to the gate of the PFET device, a portion of the spacer situated on the silicon wafer is etched away. By etching away a portion of the spacer situated on the silicon wafer, a gap 50 is created. In the invention, the distance between the silicide and the gate edge is carefully controlled in order to obtain the desired magnitude and type of stress (i.e., compressive or tensile).

Figure 5:
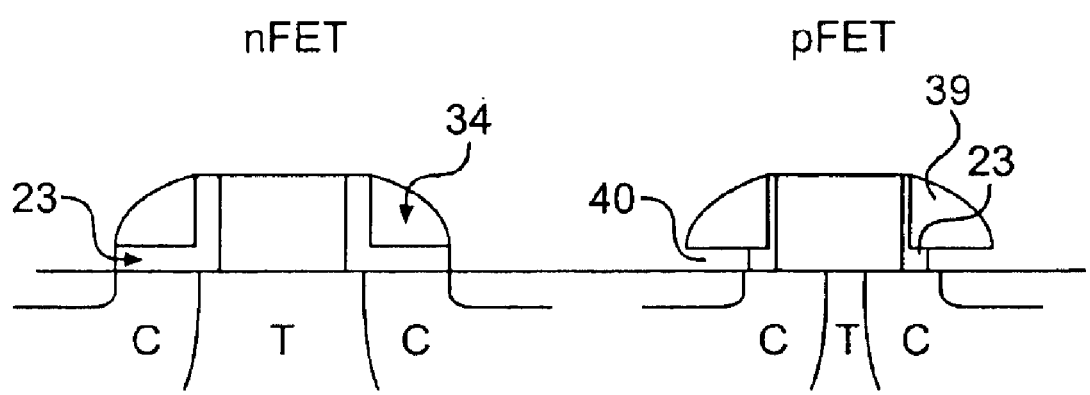
FIG. 5 illustrates the locations of the stresses in an NFET and a PFET device according to the invention.

FIG. 5 illustrates the locations of the stresses in an NFET and a PFET device according to the invention. As shown in FIG. 5, tensile stresses "T" are present in the channel of the NFET and compressive stresses "C" are present in the channel of the PFET. Further, as shown in FIG. 5, according to the invention, the oxide of the PFET is undercut in order to deposit the silicide material closer to the gate of the PFET in order to create the compressive stress under the gate region. As discussed above, the magnitude and type (i.e., compressive or tensile) can be controlled by varying the width of the oxide spacer and/or the extent of the undercut region 40 in the PFET devices. Further, by varying the distance between the deposited silicide material and the edge of the gate, it is possible to create compressive stresses C in the PFET such that the stresses in the channel of the PFET can be primarily compressive and/or completely compressive (i.e., full compression). Similarly, by varying the distance between the deposited silicide material and the edge of the gate of the NFET, it is possible to create tensile stresses T in the NFET such that the stresses in the channel of the NFET can be primarily tensile and/or completely tensile.

By providing tensile stresses to the channel of the NFET and compressive stresses in the channel of the PFETs, the charge mobility along the channels of NFET devices and the hole mobility along the channels of the PFET devices are increased. Thus, as described above, the invention provides a method for providing tensile stresses and compressive stresses along the channels of NFET and PFET devices, respectively via silicidation. In particular, this invention controls the level of tensile stresses and compressive stresses by using different spacer widths and by depositing silicide material closer to the gates of the PFETs than to the gates of the NFETs.

While the invention has been described in terms of embodiments, those skilled in the art will recognize that the invention can be practiced with modification within the spirit and scope of the appended claims.

What is claimed is:

1. A method for manufacturing an integrated circuit comprising a plurality of semiconductor devices including an n-type field effect transistor and a p-type field effect transistor on a semiconductor wafer, the method comprising:

creating a first spacer and a second spacer on the n-type field effect transistor and on the p-type field effect transistor;

removing at least a portion of the first spacer on the p-type field effect transistor; and depositing silicide forming material on the silicon wafer, such that tensile mechanical stresses are formed within a channel of the n-type field effect transistor and compressive mechanical stresses are formed within a channel of the p-type field effect transistor.

2. The method of claim 1, wherein the step of removing comprises etching at least a portion of the first spacer of the p-type field effect transistor to form a gap beneath the second spacer, the portion of the first spacer being located under the second spacer of the p-type field effect transistor.

3. The method of claim 2, wherein the step of depositing silicide material comprises depositing silicide material on the n-type field effect transistor and on the p-type field effect transistor such that the silicide material fills at least a portion of the gap of the p-type field effect transistor and the silicide material is closer to a gate edge of the p-type field effect transistor than a gate edge of the n-type field effect transistor.

4. The method of claim 1, wherein the step of creating a first spacer and a second spacer comprises:

creating an oxide spacer on the n-type field effect transistor and on the p-type field effect transistor; and creating a nitride spacer on the n-type field effect transistor and on the p-type field effect transistor.

5. The method of claim 4, wherein the step of creating oxide spacers comprises:

depositing oxide on the silicon wafer; and etching a portion of the deposited oxide to form the oxide spacer.

6. The method of claim 5, wherein the step of creating nitride spacers comprises:

depositing nitride on the silicon wafer; and etching a portion of the deposited nitride to form the nitride spacer, wherein the nitride spacer sits on the oxide spacer.

7. The method of claim 1, wherein tensile stresses between about 500 MPa and 3 GPa are formed in the channel of the n-type field effect transistor.

8. The method of claim 1, wherein compressive stresses between about 500 MPa and about 3 GPa are formed in the channel of the p-type field effect transistor.

9. The method of claim 1, further comprising removing silicide material from above the n-type field effect transistor and the p-type field effect transistor.

10. The method of claim 1, wherein the step of depositing silicide material comprises depositing at least one of Co, HF, Mo, Ni, $Pd_2$, Pt, Ta, Ti, W, and Zr.

11. The method of claim 1, further comprising removing the mask used to cover the n-type field effect transistor.

12. A method for manufacturing an integrated circuit comprising a plurality of semiconductor devices including an n-type field effect transistor and a p-type field effect transistor on a semiconductor wafer, the method comprising the steps of:

creating a spacer having a first width for the n-type field effect transistor and creating a spacer having a second width for the p-type field effect transistor, the first width being greater than the second width; and depositing silicide forming material on the semiconductor wafer such that tensile mechanical stresses are formed within a channel of the n-type field effect transistor and compressive stresses are formed within a channel of the p-type field effect transistor.

13. The method of claim 12, wherein the creating step comprises the step of etching at least about a 20 nm to about a 50 nm portion of an oxide spacer of the p-type field effect transistor.

14. The method of claim 12, wherein the creating step comprises the step of etching at least about a 20 nm to about a 50 nm portion of an oxide spacer of the p-type field effect transistor.

15. The method of claim 12, wherein the silicide material is deposited closer to a gate edge of the p-type field effect transistor than a gate edge of the n-type field effect transistor.

16. The method of claim 12, wherein the creating step comprises the steps of:

depositing a first material on the silicon wafer;

etching at least a portion of the deposited first material to form a first spacer;

depositing a second material on the silicon wafer;

etching at least a portion of the deposited second material to form a second spacer, wherein at least a portion of the second spacer is formed on the first spacer.

17. The method of claim 16, wherein the first material is oxide.

18. The method of claim 17, wherein the second material is nitride.

19. The method of claim 16, further comprising etching at least a portion of the deposited first material located under the second spacer.

20. The method of claim 12, wherein tensile stresses between about 500 MPa and 3 GPa are formed in the channel of the n-type field effect transistor.

21. The method of claim 12, wherein tensile stresses between about 500 MPa and 3 GPa are formed in the channel of the n-type field effect transistor.

22. The method of claim 12, wherein the width of the spacer having the first width is about 20 nm to about 50 nm less than the width of the second spacer having the second width.

23. The method of claim 12, wherein the width of the spacer having the second width is between about 20 nm and about 100 nm.

* * * * *